United States Patent
Zeng et al.

(10) Patent No.: US 10,754,217 B2
(45) Date of Patent: Aug. 25, 2020

(54) DISPLAY STRUCTURE AND ELECTRONIC DEVICE

(71) Applicant: BEIJING XIAOMI MOBILE SOFTWARE CO., LTD., Beijing (CN)

(72) Inventors: Zhihui Zeng, Beijing (CN); Anyu Liu, Beijing (CN); Lei Tang, Beijing (CN); Zhongsheng Jiang, Beijing (CN); Shaoxing Hu, Beijing (CN); Chengfang Sun, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/426,309

(22) Filed: May 30, 2019

(65) Prior Publication Data
US 2019/0369422 A1 Dec. 5, 2019

(30) Foreign Application Priority Data
May 31, 2018 (CN) .......................... 2018 1 0551293

(51) Int. Cl.
| G02F 1/137 | (2006.01) |
| G03B 13/02 | (2006.01) |
| H01L 27/32 | (2006.01) |
| H04M 1/02 | (2006.01) |

(52) U.S. Cl.
CPC ............. *G02F 1/137* (2013.01); *G03B 13/02* (2013.01); *H01L 27/3232* (2013.01); *G02F 2201/44* (2013.01); *H04M 1/0202* (2013.01)

(58) Field of Classification Search
None
See application file for complete search history.

(56) References Cited

U.S. PATENT DOCUMENTS

| 2015/0168776 A1* | 6/2015 | Song ................... H01L 27/326 |
| | | 349/62 |
| 2015/0219907 A1* | 8/2015 | Li ........................ G02F 1/137 |
| | | 349/15 |
| 2016/0012641 A1 | 1/2016 | Kim et al. |
| 2017/0084231 A1 | 3/2017 | Chew |

(Continued)

FOREIGN PATENT DOCUMENTS

EP 1750459 A2 2/2007

OTHER PUBLICATIONS

European Patent Office, Extended European Search Report Issued in Application No. 19177651.7, dated Sep. 30, 2019, 8 pages.

*Primary Examiner* — William B Perkey
(74) *Attorney, Agent, or Firm* — Arch & Lake LLP

(57) ABSTRACT

A display structure and an electronic device having the same are provided. The display structure includes a display screen and a light adjusting component located at a light emitting side of the display screen. An operating state of the light adjusting component comprises a light transmitting state and a polarization state, and the light adjusting component comprises a first region and a second region which are independently controllable. The display screen comprises a plurality of independently controllable pixels. Further, when the first region of the light adjusting component is in the light transmitting state, the pixels that are in the display screen and correspond to the first region are disabled to allow light emitted from the first region to penetrate through the display screen.

20 Claims, 3 Drawing Sheets

(56) References Cited

U.S. PATENT DOCUMENTS

2017/0168329 A1* 6/2017 Chang ................. G02F 1/13338
2019/0265477 A1* 8/2019 Perreault .............. G02B 3/0056
2019/0369422 A1* 12/2019 Zeng .................... G06F 1/3265

* cited by examiner

DISPLAY STRUCTURE AND ELECTRONIC DEVICE

CROSS REFERENCE TO RELATED APPLICATIONS

This application claims priority to Chinese Patent Application No. 201810551293.0 filed on May 31, 2018, the entire content of which is incorporated herein by reference.

TECHNICAL FIELD

The present disclosure relates to a display structure and an electronic device.

BACKGROUND

Smart phones are usually provided with components such as a front camera. When the smart phone is provided with a full display design (may also be referred to as full screen), it is desired to effectively ensure a normal use of the components such as the front camera.

SUMMARY

In view of this, the present disclosure provides a display structure and an electronic device.

According to a first aspect of the present disclosure, there is provided a display structure, which includes: a light adjusting component, where an operating state of the light adjusting component includes a light transmitting state and a polarization state, and the light adjusting component includes a first region and a second region which are independently controllable; and a display screen including a plurality of independently controllable pixels. The light adjusting component is located at a light emitting side of the display screen, and when the first region is in the light transmitting state, the pixels that are in the display screen and correspond to the first region are disabled to allow light emitted from the first region to penetrate through the display screen.

According to a second aspect of the present disclosure, there is provided an electronic device, which includes: a camera structure; and a display structure. The display structure may include: a light adjusting component and a display screen. An operating state of the light adjusting component includes a light transmitting state and a polarization state, and the light adjusting component includes a first region and a second region which are independently controllable. The display screen includes a plurality of independently controllable pixels. When the first region is in the light transmitting state, the pixels that are in the display screen and correspond to the first region are disabled to allow light emitted from the first region to penetrate through the display screen. The light adjusting component of the display structure is located at a light emitting side of the display screen, the camera structure is arranged at the other side of the display screen, and a lens of the camera structure is arranged corresponding to the first region.

According to a third aspect, a display apparatus may include a light adjusting component configured to operate in one of two operation states: a light transmitting state and a polarization state, the light adjusting component comprising a first region and a second region which are independently controllable. The display apparatus may further include a display screen comprising a plurality of independently controllable pixels. When the first region is in the light transmitting state, the display screen is configured to disable pixels corresponding to the first region, where the disabled pixels allow light emitted from the first region to pass through the display screen.

It is to be understood that the above general descriptions and the below detailed descriptions are merely exemplary and explanatory, and are not intended to limit the present disclosure.

BRIEF DESCRIPTION OF DRAWINGS

The accompanying drawings, which are incorporated in and constitute a part of the present description, illustrate examples consistent with the present disclosure and serve to explain the principles of the present disclosure together with the description.

DETAILED DESCRIPTION

Figure 1:
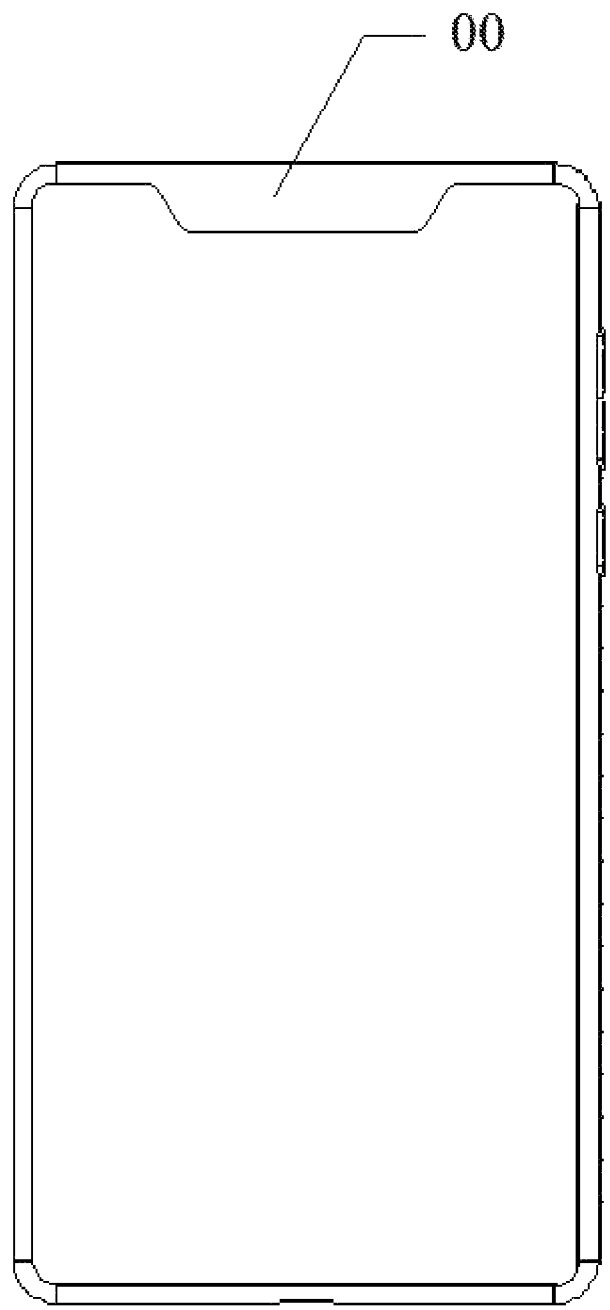
FIG. 1 is a plan schematic view illustrating an electronic device with a full screen in the related art.

Embodiments will be described in detail herein with the embodiments thereof expressed in the drawings. When the following descriptions involve the drawings, like numerals in different drawings represent like or similar elements unless stated otherwise. The implementations described in the following embodiments do not represent all implementations consistent with the present disclosure. On the contrary, they are embodiments of an apparatus and a method consistent with some aspects of the present disclosure described in detail in the appended claims.

The terms used herein are merely for describing a particular embodiment, rather than limiting the present disclosure. As used in the present disclosure and the appended claims, terms in singular forms such as "a", "said" and "the" are intended to also include plural forms, unless explicitly dictated otherwise. It should also be understood that the term "and/or" used herein means any one or any possible combination of one or more associated listed items.

It should be understood that, although it may describe an element with a term first, second, or third, etc., the element is not limited by these terms. These terms are merely for distinguishing among elements of the same kind. For example, without departing from the scope of the present disclosure, a first element can also be referred to as a second element. Similarly, a second element can also be referred to as a first element. Depending on the context, a term "if" as used herein can be interpreted as "when", "where" or "in response to".

Reference numerals in the drawings refer to as follows:
the reference numeral 00 indicates a groove;
the reference numeral 1 indicates a display structure;
the reference numeral 11 indicates a display screen;
the reference numeral 12 indicates a light adjusting component;
the reference numeral 121 indicates a first region;
the reference numeral 122 indicates a second region;
the reference numeral 131 indicates a part; and
the reference numeral 2 indicates a lens.

FIG. 1 is a plan schematic view illustrating an electronic device, e.g. a smart phone, with a full screen in the related art. As shown in FIG. 1, a full screen of the smart phone is provided with a groove 00 to form an arrangement space for accommodating components, such as a front camera. However, it is difficult to further increase a screen-to-body ratio of the smart phone since the groove 00 occupies a certain space. Further, the groove structure results in that the smart phone may not beautiful enough to satisfy the aesthetic requirements of consumers.

Figure 2:
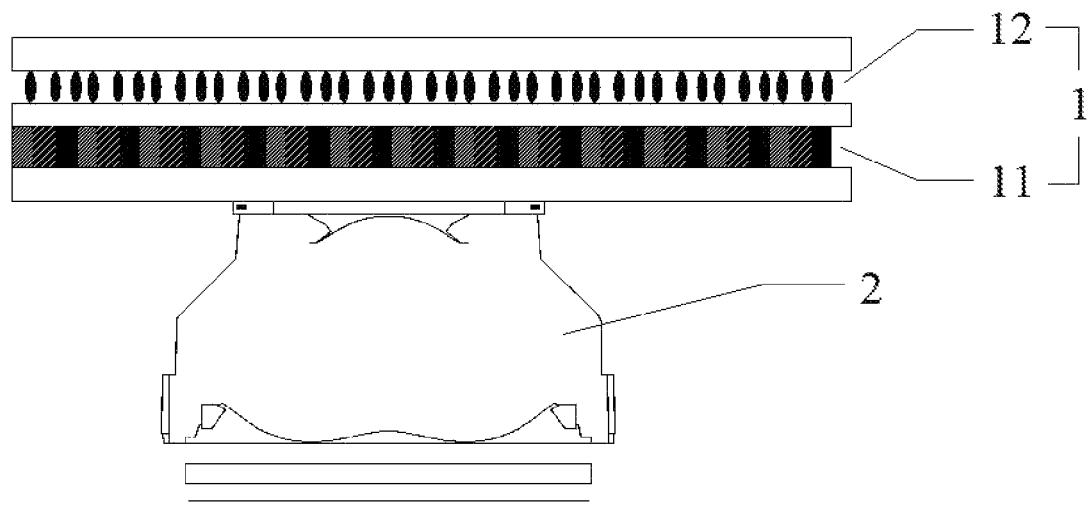
FIG. 2 is a schematic diagram illustrating a display state of a display structure according to some embodiments of the present disclosure.

According to a first aspect of the present disclosure, a display structure 1 is provided. As shown in FIG. 2, the display structure 1 includes a display screen 11 and a light adjusting component 12 disposed at a light emitting side of the display screen 11.

Figure 3:
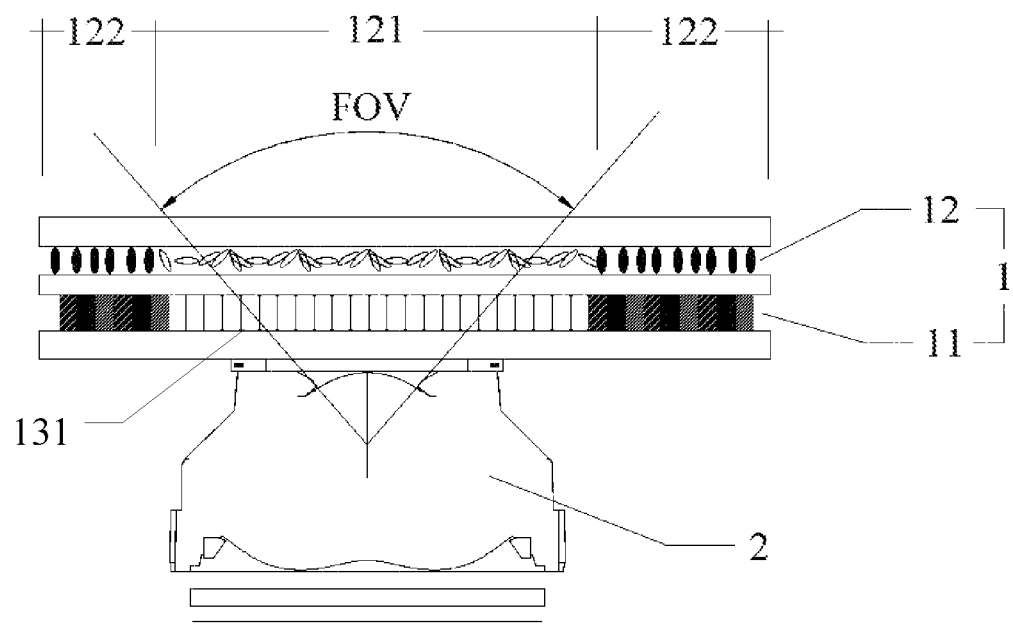
FIG. 3 is a schematic diagram illustrating a partial light transmitting state of a display structure according to some embodiments of the present disclosure.

Here, the light adjusting component 12 has two operating states: a light transmitting state and a polarization state. Further, the light adjusting component 12 includes a first region 121 and a second region 122, where the first and second regions 121 and 122 are independently controllable, as shown in FIG. 3.

The display screen 11 may include a plurality of independently controllable pixels. In one or more embodiments, when the first region 121 is in the light transmitting state, the pixels that are in the display screen 11 and correspond to the first region 121 may be disabled to allow light emitted from the first region 121 to penetrated through the display screen 11.

A working principle of the display structure provided by embodiments of the present disclosure will be described below.

Since the display screen 11 includes a plurality of independently controllable pixels and the first region 121 and the second region 122 of the light adjusting component 12 are independently controllable, the display structure 1 provided by embodiments of the present disclosure may include the following two operation states during use: a display state and a partial light transmitting state.

When the display structure 1 is operating in the display state, the pixels in the display screen 11 are enabled and the light adjusting component 12 is in the polarization state. The light adjusting component 12 arranged at the light emitting side of the display screen 11 serves as a polarizer, so that the whole display structure 1 normally displays an image.

When the display structure 1 is operating in the partial light transmitting state, the pixels that are in the display screen 11 and correspond to the first region 121 are disabled and the first region 121 in the light adjusting component 12 is in the light transmitting state. In this partial light transmitting state, light may be emitted from the first region 121 and penetrated through the display screen 11, and the first region 121 does not serve as a polarizer. In other words, the display screen 11 disables the display function by turning off the pixels correspond to the first region 121 so that light may pass through the display screen 11 to reach camera sensors.

It is to be noted that since the first region 121 and the second region 122 are independently controllable, the partial light transmitting state of the display structure 1 also includes a case that the first region 121 is in the light transmitting state and the second region 122 is in the polarization state. In this case, the pixels that are in the display screen 11 and correspond to the second region 122 are controlled to be enabled, so that a part that is in the display structure 1 and corresponds to the second region 122 may normally display an image.

For the display structure 1 provided by the present disclosure, the display state and the partial light transmitting state of the display structure 1 may be realized through the display screen 11 including a plurality of independently controllable pixels and the light adjusting component 12 having a light transmitting state and a polarization state. When the display structure 1 cooperates with another structure, such as, a camera structure, in an electronic device, a display function of the display structure 1 and a function of the another structure may be simultaneously implemented by using the first region 121 of the light adjusting component 12. The another structure may associate with the display structure 1 by the first region 121. A cooperation process will be detailed below with the cooperation of the display structure 1 provided by embodiments of the present disclosure and the camera structure as an embodiment.

A lens 2 of the camera structure may be arranged corresponding to the first region 121 of the light adjusting component 12.

When the lens 2 is not started, the display structure 1 is in the display state and the display structure 1 displays normally. In other words, the display structure 1 may be controlled to adjust its operation state according to whether the lens 2 is started or not.

When the lens 2 is started, the display structure 1 is in the partial light transmitting state. For example, in response to receiving a signal indicating that the lens 2 is started, the electronic device may switch the display structure into the partial light transmitting state. When the first region 121 of the light adjusting component 12 is in the light transmitting state, the pixels that are in the display screen 11 and correspond to the first region 121 are controlled to be disabled. As a result, a part that is in the display structure 1 and corresponds to the first region 121 is light-transmissive. In this case, the lens 2 may be used to shoot photos by acquiring light emitted into and penetrated through the display screen 11 from the first region 121. Further, since the first region 121 does not serve as a polarizer, the light penetrated through the first region 121, e.g., the light emitted into the display screen 11, is not polarized light, thereby effectively ensuring shooting quality of the lens.

In conclusion, when the display structure 1 provided by embodiments of the present disclosure is applied in an electronic device and the camera structure is started, the display structure 1 may operate in the partial light transmitting state through the cooperation of the display screen 11 and the light adjusting component 12, thereby realizing both the display function of the display structure 1 and the shooting function of the camera structure. Therefore, the front camera can be installed and used normally without arranging an opening, such as, a groove, a hole or the like, in the display structure 1. The display screen 11 in the display structure 1 may be set to an entire rectangle, square, or the like. In this way, the screen-to-body ratio of the electronic device with the display structure 1 is further increased and the full screen can be realized by using the disclosed display structure 1, thereby optimizing the external appearance of the electronic device and further satisfying the aesthetic requirement of the public.

Here, the display screen 11 may also include a first controller for respectively controlling the plurality of pixels to be enabled or disabled. For example, the first controller may connect each pixel respectively to control the plurality of pixels to work independently.

In some embodiments, the display screen 11 may be an Organic Light Emitting Diode (OLED) display screen. Since the pixels in the OLED display screen may independently work and the OLED display screen is not provided with a backlight plate, when the pixels in the OLED display screen are controlled to be disabled, the OLED display screen may be in the light transmitting state to allow light to pass through.

In some embodiments, the light adjusting component 12 may include a liquid crystal lens. By turning on or turning off an electrical field of the liquid crystal lens, the liquid crystal lens may be switched to the light transmitting state or the polarization state.

The liquid crystal lens may include liquid crystal molecules. Since the liquid crystal molecules have an electro-optic effect, the liquid crystal molecules may be presented in different arrangement manners under an action of the electrical field, thereby achieving different optical performances of the liquid crystal lens. In some embodiments of the present disclosure, the light adjusting component 12 may be switched between the light transmitting state and the polarization state based on the electro-optic effect of the liquid crystal molecules. A working principle of the light adjusting component 12 will be described below.

As shown in FIG. 2, when the electrical field of the liquid crystal lens is turned on, the liquid crystal molecules in the liquid crystal lens are regularly arranged under an action of the electrical field. At this time, only the light vibrated along a preset direction may pass through a gap between the liquid crystal molecules. In other words, the liquid crystal lens has a polarization function, and the light adjusting component 12 is in the polarization state.

As shown in FIG. 3, when the electrical field of the liquid crystal lens is turned off, the liquid crystal molecules in the liquid crystal lens are irregularly arranged. At this time, the light vibrated along each direction may pass through the liquid crystal lens, and the light adjusting component 12 is in the light transmitting state.

In some embodiments, the light adjusting component 12 may also include a second controller. The second controller is to control the electrical field of the liquid crystal lens of the first region 121 and the second region 122 to be turned on and turned off, respectively. The operating states of the first region 121 and the second region 122 may be respectively controlled by the second controller, so that the display structure 1 has both the display state and the partial light transmitting state.

It is to be noted that the liquid crystal lens in the light adjusting component 12 may cover an effective display region of the display screen 11. The effective display region of the display screen 11 refers to a region that is in the display screen 11 and viewable by a user. The liquid crystal lens covers the effective display region of the display screen 11, thereby effectively avoiding a case that the display structure 1 cannot display normally due to a lack of a polarizer. In this way, an image displayed by the display screen 11 is relatively complete without omission.

The display structure 1 provided by an example of the present disclosure may have the display state and the partial light transmitting state. When the display structure 1 cooperates with another structure, such as, a camera structure, the display structure 1 and the another structure may be normally used at the same time without arranging an opening (such as a hole, or a groove) in the display structure 1, thereby further increasing the screen-to-body ratio of the electronic device with the display structure 1. In this case, the external appearance of the electronic device is optimized and the user requirements are satisfied as possible.

It is also to be noted that when the display structure 1 provided by the present disclosure is in the display state, both the first region 121 and the second region 122 of the light adjusting component 12 are in the polarization state, so that the effective display region of the display structure 1 may display normally. Contents displayed in the effective display region of the display structure 1 are relatively complete, thereby effectively avoiding a loss of displayed information caused by arranging the opening in the display structure 1.

According to a second aspect of the present disclosure, there is provided an electronic device, which includes the display structure 1 provided in the above first aspect and a camera structure.

Figure 4:
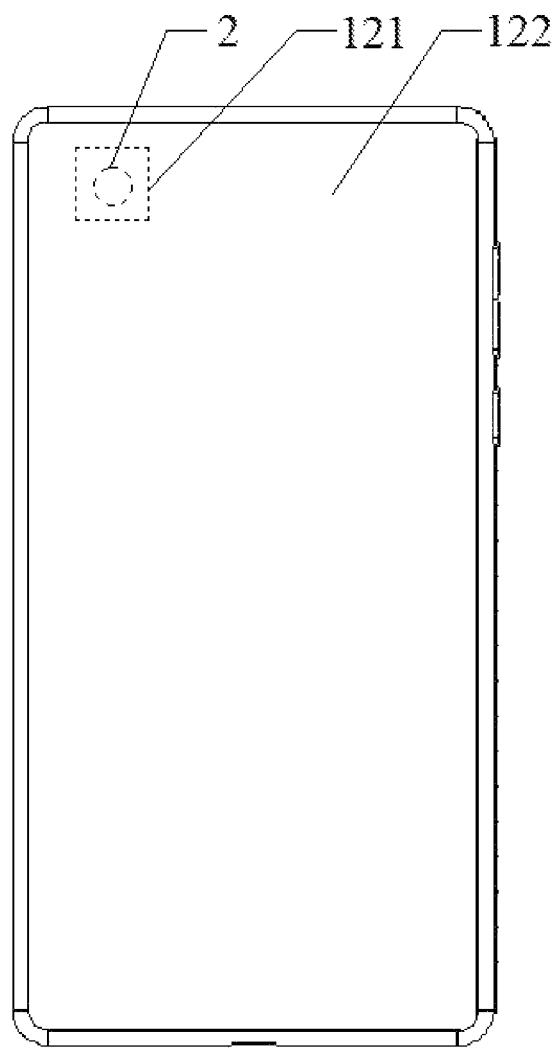
FIG. 4 is a plan schematic view illustrating an electronic device according to some embodiments of the present disclosure.

The light adjusting component 12 of the display structure 1 may be located at a light emitting side of the display screen 11, and the camera structure may be arranged at the other side of the display screen 11. As shown in FIG. 4, the lens 2 of the camera structure may be arranged corresponding to the first region 121.

During use, the electronic device provided by the present disclosure has a display mode and a shooting mode.

When the electronic device is in the display mode, the camera structure is turned off, and the display structure 1 is in the display state. At this case, the display structure 1 normally displays an image.

When the electronic device is in the shooting mode, the camera structure is started or activated, and the display structure 1 is in the partial light transmitting state. At this case, a part that is in the display structure 1 and corresponds to the first region 121 is light-transmissive, so that the lens 2 of the camera structure may shoot photos by acquiring the light emitted into and penetrated through the display screen 11 from the first region 121.

In addition, when the electronic device is in the shooting mode, the second region 122 of the light adjusting component 12 in the display structure 1 is in the polarization state, that is, a part that is in the display structure 1 and corresponds to the second region 122 may still display normally.

For the electronic device provided by the present disclosure, the camera structure and the display structure 1 may be normally used at the same time without arranging an opening, such as, a groove, or a hole, in the display screen 11. Therefore, the structure completeness of the display screen 11 is effectively ensured, which not only further increases the screen-to-body ratio of the electronic device, and but also further optimizes the external appearance of the electronic device at the same time to satisfy the customer requirements as possible.

In an example, as shown in FIG. 2, the first region 121 of the light adjusting component 12 and a part that is in the display screen 11 and corresponds to the first region 121 both cover a Field of Vision (FOV) of the lens 2. The FOV determines a field of view of the lens 2. Therefore, by covering the field of view of the lens 2 with the first region 121 and the part that is in the display screen 11 and corresponds to the first region 121, it is effectively ensured that the lens 2 acquires complete image information within its field of view.

Since a region covered by the FOV is conical, region areas corresponding to the FOV at different distances from the lens 2 may be different. In some embodiments of the present disclosure, the first region 121 covers the FOV, that is, the first region 121 covers a region corresponding to the FOV in the light adjusting component 12. Similarly, the part that is in the display screen 11 and corresponds to the first region 121 covers the FOV, that is, the part that is in the display screen 11 and corresponds to the first region 121 covers a region corresponding to the FOV in the display screen 11.

In consideration of thicknesses of the display screen 11 and the light adjusting component 12, a size of the part 131 that is in the display screen 11 and corresponds to the first region 121 is less than or equal to a size of the first region 121. Since the region covered by the FOV is conical and the display screen 11 is closer to the lens 2 compared with the light adjusting component 12, the FOV may still be covered when the size of the part 131 that is in the display screen 11 and corresponds to the first region 121 is less than or equal to the size of the first region 121. Further, when the size of the part that is in the display screen 11 and corresponds to the first region 121 is not greater than the size of the first region 121, it avoids a situation that display information is omitted when the corresponding pixels in the part 131 are controlled to be disabled.

It is also to be noted that to effectively ensure the completeness of an image displayed by the display structure 1 in the partial light transmitting state, the size of the first region 121 should not be excessively large, as long as the first region 121 may cover the FOV of the lens 2. Further, the shape of the first region 121 may include, but not limited to, a rectangle, a circle, an ellipse and so on.

In some embodiments, when the first region 121 is in the light transmitting state, a light transmittance of the first region 121 is configured as follows: a light amount emitted into and penetrated through the display screen 11 from the first region 121 is not less than a lower limit of an allowable shooting light amount of the lens 2, so as to effectively ensure normal shooting and shooting quality of the lens 2.

In some embodiments, the electronic device may also include a controlling apparatus, such as, a processor. The controlling apparatus is electrically connected to the display structure 1, and may send a controlling instruction to the display structure 1 when receiving a starting instruction of the camera structure. The controlling instruction is configured to enable the first region 121 of the light adjusting component 12 to be in the light transmitting state and disable the pixels that are in the display screen 11 and correspond to the first region 121.

At this case, the part that is in the display structure 1 and corresponds to the first region 121 is light-transmissive, and the display structure 1 is in the partial light transmitting state. The lens 2 may shoot by acquiring the light emitted into and penetrated through the display screen 11 from the first region 121.

Meanwhile, the controlling instruction sent from the controlling apparatus to the display structure 1 is also configured to enable the second region 122 of the light adjusting component 12 to be in the polarization state and enable the pixels that are in the display screen 11 and correspond to the second region 122. At this case, the part that is in the display structure 1 and corresponds to the second region 122 displays normally.

Further, it may be realized that when an image is acquired by the camera structure, the acquired image is synchronously displayed on the part that is in the display structure 1 and corresponds to the second region 122.

When the light adjusting component 12 includes a liquid crystal lens, the controlling instruction sent from the controlling apparatus to the display structure 1 is configured to turn off the electrical field of the liquid crystal lens of the first region 121 in the light adjusting component 12, so that liquid crystal molecules in the liquid crystal lens of the first region 121 are irregularly distributed, and the first region 121 is in the light transmitting state. Meanwhile, the controlling instruction is also configured to turn on the electrical field of the liquid crystal lens of the second region 122 in the light adjusting component 12, so that liquid crystal molecules in the liquid crystal lens of the second region 122 are regularly distributed, and the second region 122 is in the polarization state.

In some embodiments, the display structure 1 may include a front display structure, and the camera structure may include a front camera structure. In some embodiments, the display structure 1 may include a rear display structure, and the camera structure may include a rear camera structure. Further, the display structure 1 may include the front display structure and the rear display structure at the same time, and the camera structure may include the front camera structure cooperating with the front display structure and the rear camera structure cooperating with the rear display structure.

For the electronic device provided by the present disclosure, when the camera structure is started, the display structure 1 and the camera structure may be normally used at the same time through the cooperation of the display screen 11 and the light adjusting component 12, without arranging an opening, such as, a groove, in the display screen 11. In this case, the screen-to-body ratio is further increased to achieve the full screen effectively, and the external appearance of the electronic device is optimized to satisfy the aesthetic requirements of the public effectively.

The display structure of the present disclosure has at least the following beneficial effects.

A display state and a partial light transmitting state of the display structure may be realized with a display screen including a plurality of independently controllable pixels and a light adjusting component having a light transmitting state and a polarization state. When the display structure cooperates with the camera structure and the like, a display function of the display structure and a camera function of the camera structure may be implemented at the same time by using the first region of the light adjusting component. The camera structure may associate with the display structure by the first region. Therefore, when the display structure is applied in an electronic device, the display structure and the camera structure may be normally used at the same time through cooperation of the display screen and the light adjusting component without arranging an opening in the display structure. In this case, a screen-to-body ratio of the electronic device is further increased, thereby realizing a full screen in a real sense, and optimizing an external appearance of the electronic device.

After considering the specification and practicing the present disclosure, the persons of skill in the prior art may easily conceive of other implementations of the present disclosure. The present disclosure is intended to include any variations, uses and adaptive changes of the present disclosure. These variations, uses and adaptive changes follow the general principle of the present disclosure and include common knowledge or conventional technical means in the art not disclosed in the present disclosure. The specification and examples herein are intended to be illustrative only and the real scope and spirit of the present disclosure are indicated by the claims of the present disclosure.

It is to be understood that the present disclosure is not limited to the precise structures described above and shown in the accompanying drawings and may be modified or changed without departing from the scope of the present disclosure. The scope of the present disclosure is limited only by the appended claims.

What is claimed is:

1. A display structure, comprising:
 a light adjusting component, wherein an operating state of the light adjusting component comprises a light transmitting state and a polarization state, and the light adjusting component comprises a first region and a second region which are independently controllable; and a display screen comprising a plurality of independently controllable pixels;

wherein the light adjusting component is located at a light emitting side of the display screen, and when the first region is in the light transmitting state, pixels in the display screen corresponding to the first region are disabled to allow light emitted from the first region to penetrate through the display screen.

2. The display structure of claim 1, wherein the display screen further comprises a first controller, and wherein the first controller is configured to respectively control the plurality of independently controllable pixels to be enabled or disabled.

3. The display structure of claim 2, wherein the first region and the second region of the light adjusting component comprise a liquid crystal lens;

wherein the liquid crystal lens is switched to the light transmitting state from the polarization state by turning off an electrical field of the liquid crystal lens; and wherein the liquid crystal lens is switched to the polarization state from the light transmitting state by turning on the electrical field of the liquid crystal lens.

4. The display structure of claim 3, wherein the light adjusting component further comprises a second controller, and wherein the second controller is configured to respectively control the electrical field of the liquid crystal lens to be turned on and turned off.

5. The display structure of claim 3, wherein the liquid crystal lens covers an effective display region of the display screen.

6. The display structure of claim 1, wherein the display screen is an Organic Light Emitting Diode (OLED) display screen.

7. An electronic device, comprising:

a camera; and a display structure, comprising:

a light adjusting component, wherein an operating state of the light adjusting component comprises a light transmitting state and a polarization state, and the light adjusting component comprises a first region and a second region which are independently controllable; and a display screen comprising a plurality of independently controllable pixels, wherein pixels that are in the display screen and correspond to the first region are disabled to allow light emitted from the first region to penetrate through the display screen when the first region is in the light transmitting state;

wherein the light adjusting component of the display structure is located at a light emitting side of the display screen, the camera is arranged at the other side of the display screen, and a lens of the camera is arranged corresponding to the first region.

8. The electronic device of claim 7, wherein the display screen further comprises:

a first controller configured to respectively control the plurality of independently controllable pixels to be enabled or disabled.

9. The electronic device of claim 7, wherein the first region and the second region of the light adjusting component comprise a liquid crystal lens;

wherein the liquid crystal lens is switched to the light transmitting state from the polarization state by turning off an electrical field of the liquid crystal lens; and wherein the liquid crystal lens is switched to the polarization state from the light transmitting state by turning on the electrical field of the liquid crystal lens.

10. The electronic device of claim 9, wherein the light adjusting component further comprises a second controller, and wherein the second controller is configured to respectively control the electrical field of the liquid crystal lens to be turned on and turned off.

11. The electronic device of claim 9, wherein the liquid crystal lens covers an effective display region of the display screen.

12. The electronic device of claim 7, wherein the display screen comprises an Organic Light Emitting Diode (OLED) display screen.

13. The electronic device of claim 7, wherein the first region and a part that is in the display screen and corresponds to the first region both cover a Field of Vision (FOV) of the lens.

14. The electronic device of claim 7, further comprising:

a controlling apparatus electrically connected to the display structure and configured to send a controlling instruction to the display structure when receiving a starting instruction of the camera, wherein the controlling instruction enables the first region of the light adjusting component to be in the light transmitting state and disables the pixels that are in the display screen and correspond to the first region.

15. The electronic device of claim 7, wherein the display structure comprises a front display structure, and the camera comprises a front camera.

16. The electronic device of claim 7, wherein the display structure comprises a rear display structure, and the camera comprises a rear camera.

17. A display apparatus, comprising:

a light adjusting component configured to operate in one of two operation states: a light transmitting state and a polarization state, the light adjusting component comprising a first region and a second region which are independently controllable; and a display screen comprising a plurality of independently controllable pixels;

wherein when the first region is in the light transmitting state, the display screen is configured to disable pixels corresponding to the first region, the disabled pixels allowing light emitted from the first region to pass through the display screen.

18. The display apparatus of claim 17, wherein the display screen further comprises a first controller, and wherein the first controller is configured to respectively control the plurality of independently controllable pixels to be enabled or disabled.

19. The display apparatus of claim 17, wherein the first region and the second region of the light adjusting component comprise a liquid crystal lens;

wherein the liquid crystal lens is switched to the light transmitting state from the polarization state by turning off an electrical field of the liquid crystal lens; and wherein the liquid crystal lens is switched to the polarization state from the light transmitting state by turning on the electrical field of the liquid crystal lens.

20. The display apparatus of claim 19,
wherein the light adjusting component further comprises a second controller, and
wherein the second controller is configured to respectively control the electrical field of the liquid crystal lens to be turned on and turned off.

\* \* \* \* \*